(12) United States Patent
Norton et al.

(10) Patent No.: US 11,556,156 B2
(45) Date of Patent: Jan. 17, 2023

(54) ADAPTABLE CARRIER FOR ENTERPRISE DATACENTER SOLID-STATE DRIVES

(71) Applicant: HEWLETT PACKARD ENTERPRISE DEVELOPMENT LP, Houston, TX (US)

(72) Inventors: John Norton, Houston, TX (US); Paul Kaler, Houston, TX (US); Daniel W. Tower, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 3 days.

(21) Appl. No.: 17/236,560

(22) Filed: Apr. 21, 2021

(65) Prior Publication Data

US 2022/0342463 A1    Oct. 27, 2022

(51) Int. Cl.
*G06F 1/18* (2006.01)
*H05K 7/14* (2006.01)

(52) U.S. Cl.
CPC .............. *G06F 1/187* (2013.01); *H05K 7/14* (2013.01)

(58) Field of Classification Search
CPC .................................. G06F 1/187; H05K 7/14
See application file for complete search history.

(56) References Cited

U.S. PATENT DOCUMENTS

| 9,420,718 B2 * | 8/2016 | Du ........................ G11B 33/124 |
| 10,401,922 B2 * | 9/2019 | Ehlen ...................... G06F 1/187 |
| 11,200,920 B1 * | 12/2021 | Chang .................. G11B 33/022 |

* cited by examiner

*Primary Examiner* — James Wu
*Assistant Examiner* — Hung Q Dang
(74) *Attorney, Agent, or Firm* — Nolte Lackenbach Siegel

(57) ABSTRACT

A solid-state drive (SSD) carrier comprises a front structure, a first side structure extending perpendicularly from a first end of the front structure, and a second side structure extending perpendicularly from a second end of the front structure. The front structure and the first and second side structures defining an internal volume sufficient to contain an SSD conforming to any one of a plurality of different SSD form factors. At least one light pipe extends through in the front structure, and is configured to direct light from an indicator LED on a front face of the SSD to a location on a front face of the front structure.

20 Claims, 16 Drawing Sheets

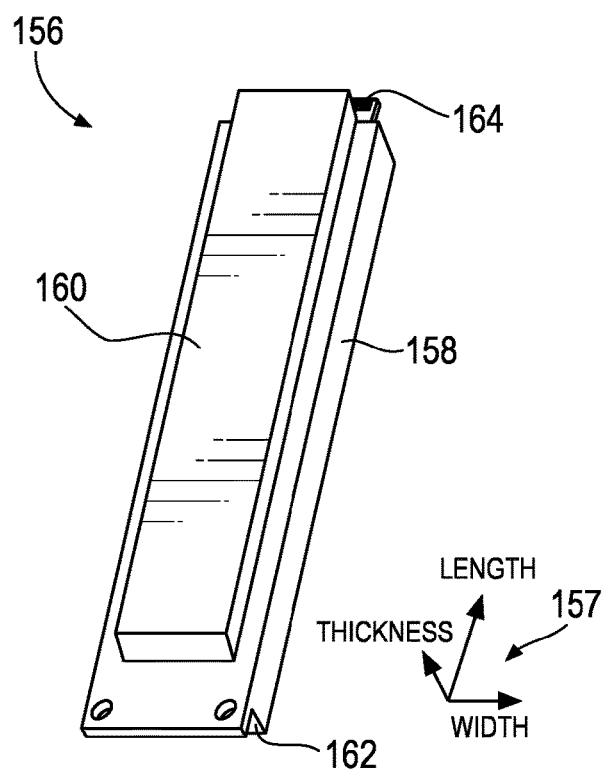
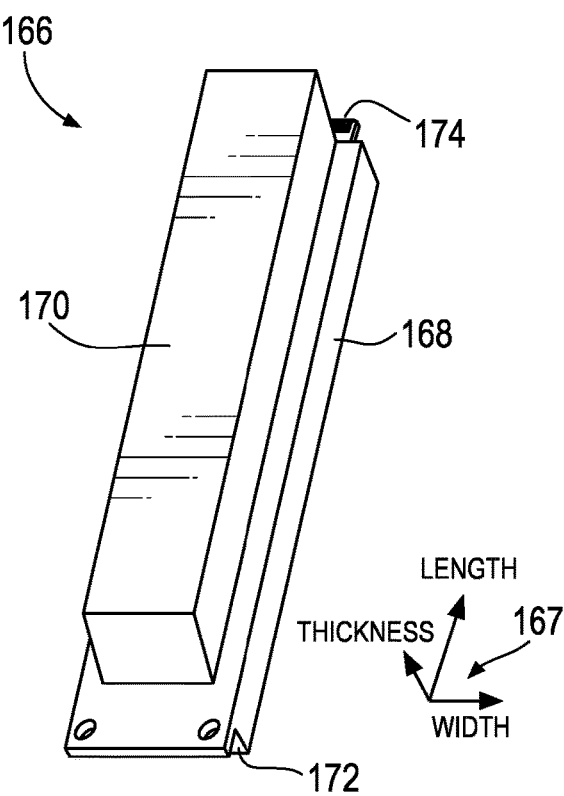
FIG. 1F (PRIOR ART)
FIG. 1G (PRIOR ART)

ADAPTABLE CARRIER FOR ENTERPRISE DATACENTER SOLID-STATE DRIVES

BACKGROUND

Computing system datacenters may include compute systems including solid-state drives ("SSDs") for data storage. Certain enterprise and data center standard form factors ("EDSFFs") for SSDs may be preferred. Various EDSFFs may have differing physical dimensions, card edge placement, mounting hole locations, and light emitting diode ("LED") indicator placements.

BRIEF DESCRIPTION OF THE DRAWINGS

The present disclosure is best understood from the following detailed description when read with the accompanying figures, wherein:

FIGS. 1A-1G illustrate a plurality of prior art SSDs of differing form factors;

Figure 1A:
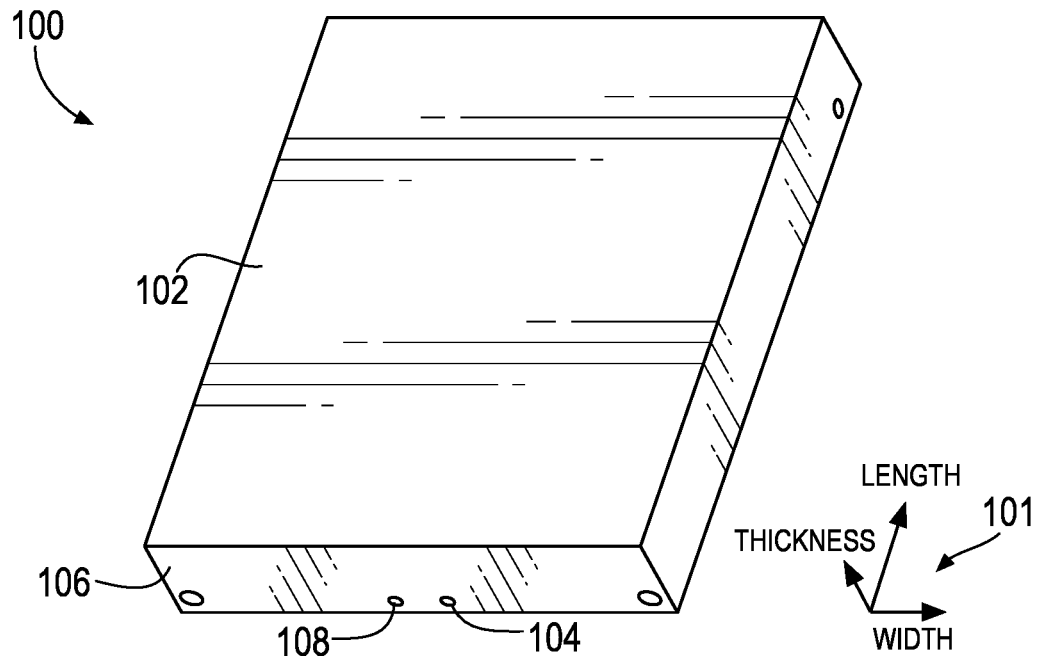

It is emphasized that in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Further, as used herein, the term "power conductor" is intended to refer to any one or more conductive elements, such as wires, cables, ribbons, electrical traces, and the like, capable of conducting alternating current ("AC") and/or direct current ("DC") voltages from one point to another.

As used herein, to "provide" an item means to have possession of and/or control over the item. This may include, for example, forming (or assembling) some or all of the item from its constituent materials and/or, obtaining possession of and/or control over an already-formed item.

Presently there are a plurality of EDSFFs defined by the SFF Technology Work Affiliate Technical Work Group of the Storage Networking Industry Association (SNIA). Various SNIA EDSFFs are specified according to their different physical dimensions, card edge placements, mounting hole locations, and LED indicator placements. Different vendors may implement one or more SSDs conforming to the various SNIA EDSFF standards.

The following Table 1 summarizes the physical dimensions of SSDs conforming to EDSFF E1.S and E3.S specifications (all dimensions expressed in units of millimeters):

TABLE 1

|           | EDSFF E3.S | EDSFFF E3.S 2T | EDSFF E1.S |
|-----------|------------|----------------|------------|
| THICKNESS | 7.50       | 16.80          | 5.90  8.01  9.50  15.00  25.00 |
| LENGTH    |            | 112.75         | 111.49  118.75 |
| HEIGHT    |            | 76.00          | 31.50  33.75 |

Examples of adaptable SSD carriers are described herein which are adaptable to accommodate a plurality of different SSDs having differing dimensions such as are found in varying specifications for SSD form factors. In some examples, adaptable SSD carriers include a front structure including a light pipe assembly for directing light from indicator LEDs on SSDs installed in the carriers to a front face of the carrier. The light pipe assembly enables a single adaptable SSD carrier in various examples to accommodate a plurality of different SSDs of varying specifications, thereby reducing the number of different carriers to be provided for a given compute system regardless of the various SSDs that may be chosen to be included in the compute system.

FIG. 1A is a front isometric view illustrating an SSD 100 according to an E3.S 2T ESDFF.SSD 100 has length, width, and thickness dimensions, as indicated by orientation legend 101, corresponding to the values set forth in Table 1. Reference numeral 102 designates the overall SSD volume specified for E3.S SSDs such as SSD 100, although in various examples of E3.S 2T SSDs the circuitry and other components of the SSD may not occupy the entirety of SSD volume 102. SSD 100 may have a first indicator light-emitting diode (LED) 104 on a front face 106 thereof for indicating power and activity of SSD 100. SSD 100 may have a second indicator LED 108 on front face 106 for indicating attention or error conditions for SSD 100.

Figure 1B:
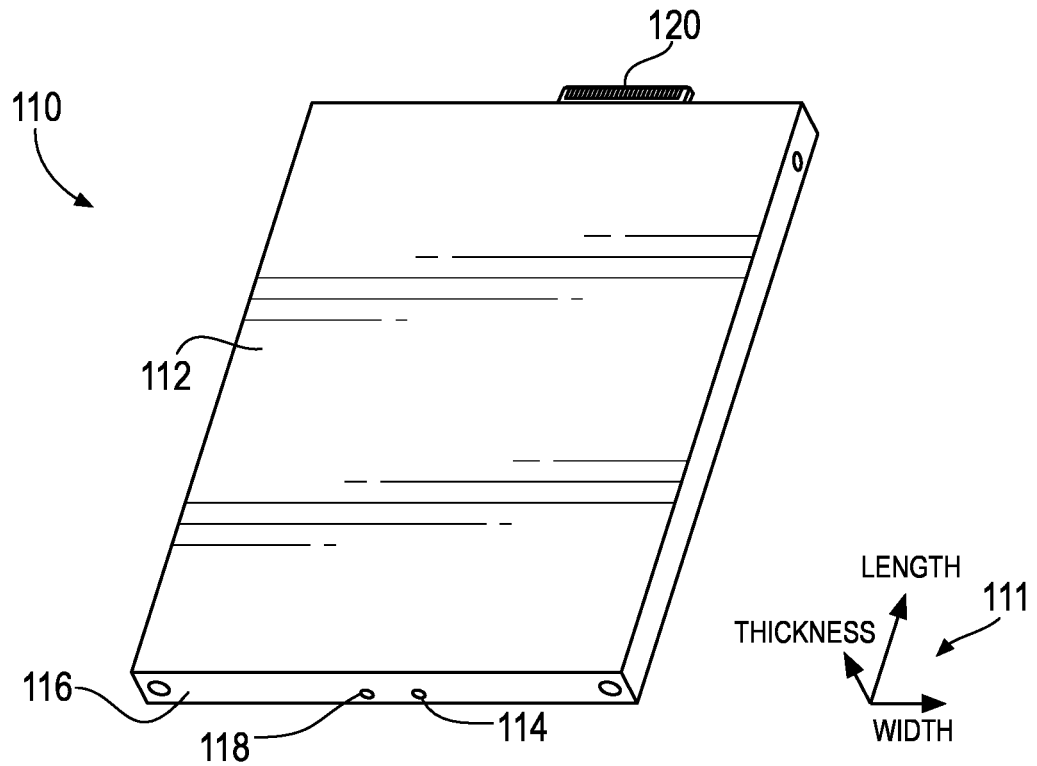

FIG. 1B is a front isometric view illustrating an SSD 110 according to an E3.S ESDFF.SSD 100 has length, width, and thickness dimensions, as indicated by orientation legend 111, corresponding to the values set forth in Table 1. Reference numeral 112 designates the overall SSD volume specified for E3.S SSDs such as SSD 110, although in various examples of E3.S SSDs the circuitry and other components of the SSD may not occupy the entirety of SSD volume 112. SSD 110 may have a first indicator light-emitting diode (LED) 114 on a front face 116 thereof for indicating power and activity of SSD 110. SSD 110 may have a second indicator LED 118 on front face 116 for indicating attention or error conditions for SSD 110. In this example, indicator LEDs 114 and 118 are arranged side-by-side in the thickness dimension of SSD 110, and may be spaced 4 millimeters apart.

Also visible in FIG. 1B is a rear card edge connector 120 for connection of SSD 110 to circuitry such as with a backplane connection (not shown) of a datacenter compute system. The location, pin count, and pin definitions of card edge connectors such as card edge connector 120 are specified as part of each E1.S and E3.S specification.

Figure 1C:
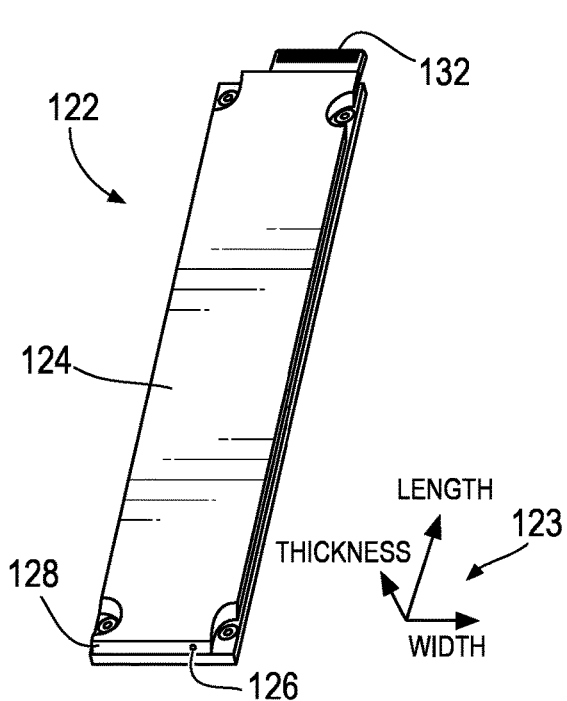

FIG. 1C is a front isometric view illustrating an SSD 122 according to an E1.S 5.90 ESDFF.SSD 122 has length, width, and thickness dimensions, as indicated by orientation legend 123, corresponding to the values set forth in Table 1. Reference numeral 124 designates the overall SSD volume specified for E1.S 5.90 SSDs such as SSD 122, although in various examples of E1.S 5.90 SSDs the circuitry and other components of the SSD may not occupy the entirety of SSD volume 124. SSD 122 may have a first indicator light-emitting diode (LED) 126 on a front face 128 thereof for indicating power and activity of SSD 122. SSD 122 may have a second indicator LED (not visible in FIG. 1C) on front face 128 for indicating attention or error conditions for SSD 122. Also visible in FIG. 1C is a rear card edge connector 132 for connection of SSD 122 to circuitry such as with a backplane connection (not shown) of a datacenter compute system. The location, pin count, and pin definitions of card edge connectors such as card edge connector 132 are specified as part of each E1.S and E3.S specification.

Figure 1D:
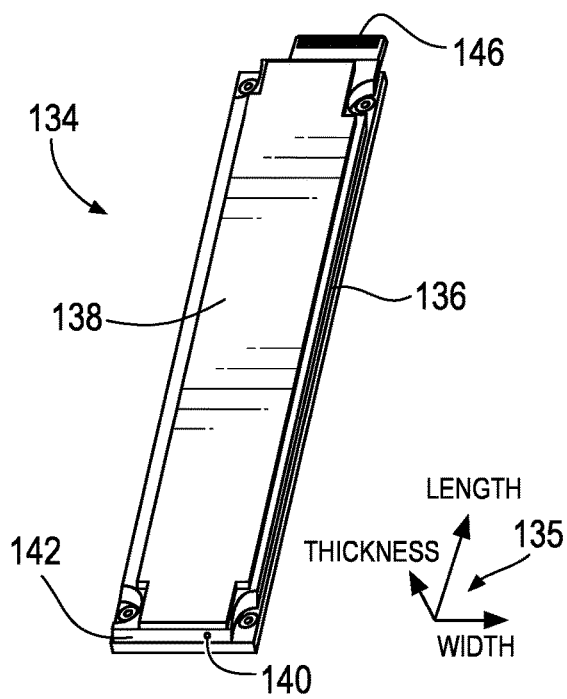

FIG. 1D is a front isometric view illustrating an SSD 134 according to an E1.S 8.01 ESDFF.SSD 134 has length, width, and thickness dimensions, as indicated by orientation legend 135, corresponding to the values set forth in Table 1. Reference numeral 136 designates the overall SSD volume specified for E1.S 5.90 SSDs such as SSD 134, while reference numeral 138 designates the overall heat sink volume specified for a heat sink structure associated with SSD 134, although in various examples of E1.S 5.90 SSDs the circuitry and other components of the SSD may not occupy the entirety of SSD volume 136, and the heat sink element of an SSD may not occupy the entirety of heat sink volume 138. SSD 134 may have a first indicator light-emitting diode (LED) 140 on a front face 142 thereof for indicating power and activity of SSD 134. SSD 134 may have a second indicator LED 144 on front face 142 for indicating attention or error conditions for SSD 134. Also visible in FIG. 1D is a rear card edge connector 146 for connection of SSD 134 to circuitry such as with a backplane connection (not shown) of a datacenter compute system. The location, pin count, and pin definitions of card edge connectors such as card edge connector 146 are specified as part of each E1.S and E3.S specification.

Figure 1E:
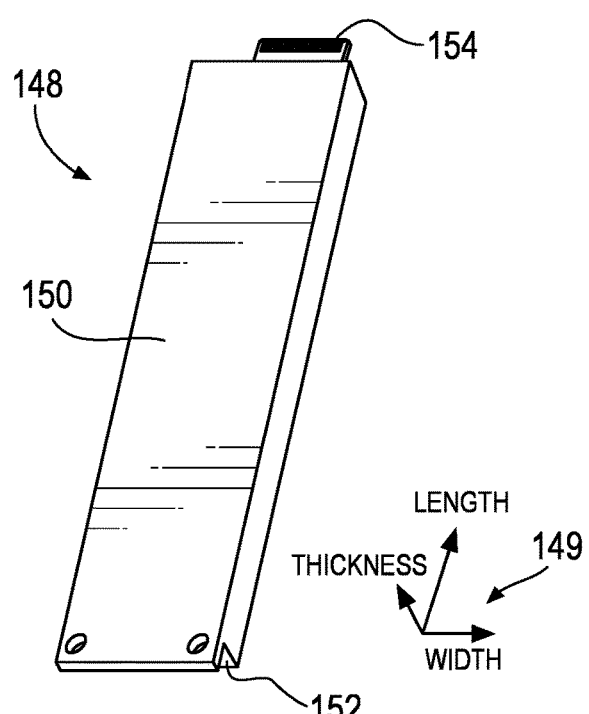

FIG. 1E is a front isometric view illustrating an SSD 148 according to an E1.S 9.50 ESDFF.SSD 148 has length, width, and thickness dimensions, as indicated by orientation legend 149, corresponding to the values set forth in Table 1. Reference numeral 150 designates the overall volume specified for E1.S 9.50 SSDs such as SSD 148, although in various examples of E1.S 9.50 SSDs the circuitry and other components of the SSD may not occupy the entirety of volume 150. Indicator lights on a front face 152 of SSD 148 are not visible in the view of FIG. 1E. FIG. 1E does show a rear card edge connector 154 for connection of SSD 148 to circuitry such as with a backplane connection (not shown) of a datacenter compute system. The location, pin count, and pin definitions of card edge connectors such as card edge connector 154 are specified as part of each E1.S and E3.S specification.

FIG. 1F is a front isometric view illustrating an SSD 156 according to an E1.S 15.00 ESDFF.SSD 156 has length, width, and thickness dimensions, as indicated by orientation legend 157, corresponding to the values set forth in Table 1. Reference numeral 158 designates the overall volume specified for E1.S 15.00 SSDs such as SSD 156, while reference numeral 160 designates the overall volume specified for a heat sink associated with SSD 156, although in various examples of E1.S 15.00 SSDs the circuitry and other components of the SSD may not occupy the entirety of volume 158, and the heat sink element of an SSD may not occupy the entirety of volume 160. Indicator lights on a front face 162 of SSD 156 are not visible in the view of FIG. 1F. FIG. 1F does show a rear card edge connector 164 for connection of SSD 156 to circuitry such as with a backplane connection (not shown) of a datacenter compute system. The location, pin count, and pin definitions of card edge connectors such as card edge connector 164 are specified as part of each E1.S and E3.S specification.

FIG. 1G is a front isometric view illustrating an SSD 166 according to an E1.S 25.00 ESDFF.SSD 166 has length, width, and thickness dimensions, as indicated by orientation legend 167, corresponding to the values set forth in Table 1. Reference numeral 168 designates the overall volume specified for E1.S 25.00 SSDs such as SSD 166, while reference numeral 170 designates the overall volume specified for a heat sink associated with SSD 166, although in various examples of E1.S 25.00 SSDs the circuitry and other components of the SSD may not occupy the entirety of volume 168, and the heat sink element of an SSD may not occupy the entirety of heat sink volume 170. Indicator lights on a front face 172 of SSD 166 are not visible in the view of FIG. 1G. FIG. 1G does show a rear card edge connector 174 for connection of SSD 166 to circuitry such as with a backplane connection (not shown) of a datacenter compute system. The location, pin count, and pin definitions of card edge connectors such as card edge connector 174 are specified as part of each E1.S and E3.S specification.

Figure 2:
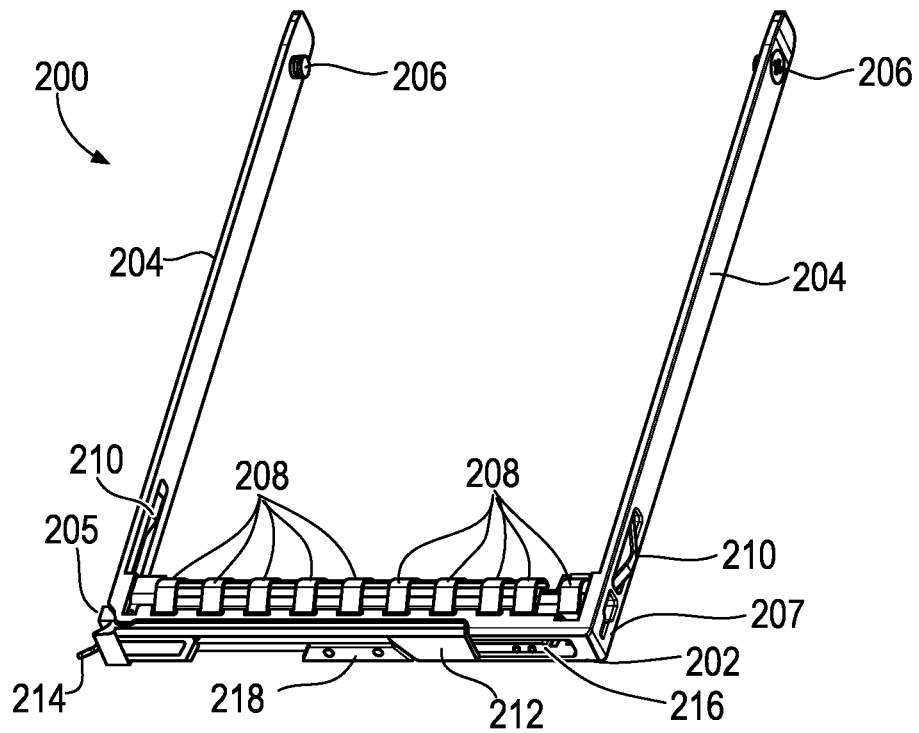
FIG. 2 is a front isometric view illustrating an adaptable carrier for SSDs of a plurality of different form factors according to one or more examples.

FIG. 2 is a front isometric view illustrating an adaptable carrier 200 according to one or more examples for facilitating the installation of any of a plurality SSDs of differing form factors into a compute system. As shown in FIG. 2, adaptable carrier 200 includes a front structure 202 having a first side structure 204 extending perpendicularly from a first end 205 thereof and a second side structure 204 extending perpendicularly from a second end 207 thereof, forming a substantially U-shaped structure with squared corners. Side structures 204 may each have a screw 206 therein for attachment of adaptable carrier 200 to an SSD or an SSD adaptor, as herein described. A plurality of spring clips 208 may be provided on front structure 202 for securing adaptable carrier 200 in a compute system (not shown in FIG. 2). Side spring clips 210 may be provided in side structures 204 for further securing adaptable carrier 200 within a compute system.

Front structure 202 may further include a hinged handle 212 biased with a spring 214 to swivel forward upon depression of a handle release button 216. Once swiveled open, hinged handle 212 facilitates removal of adaptable carrier 200 from a compute system. In various examples, front structure 202 may also include an indicator light bezel 218, described herein in further detail, for exposing indicator lights reflecting operation of an installed SSD to be visible at the front of adaptable carrier 200. In particular, as herein described, in some examples, front structure 202 may contain a light pipe assembly (not shown in FIG. 2) for directing light from indicator lights on an installed SSD through front structure 202 and indicator light bezel 218.

Figure 3A:
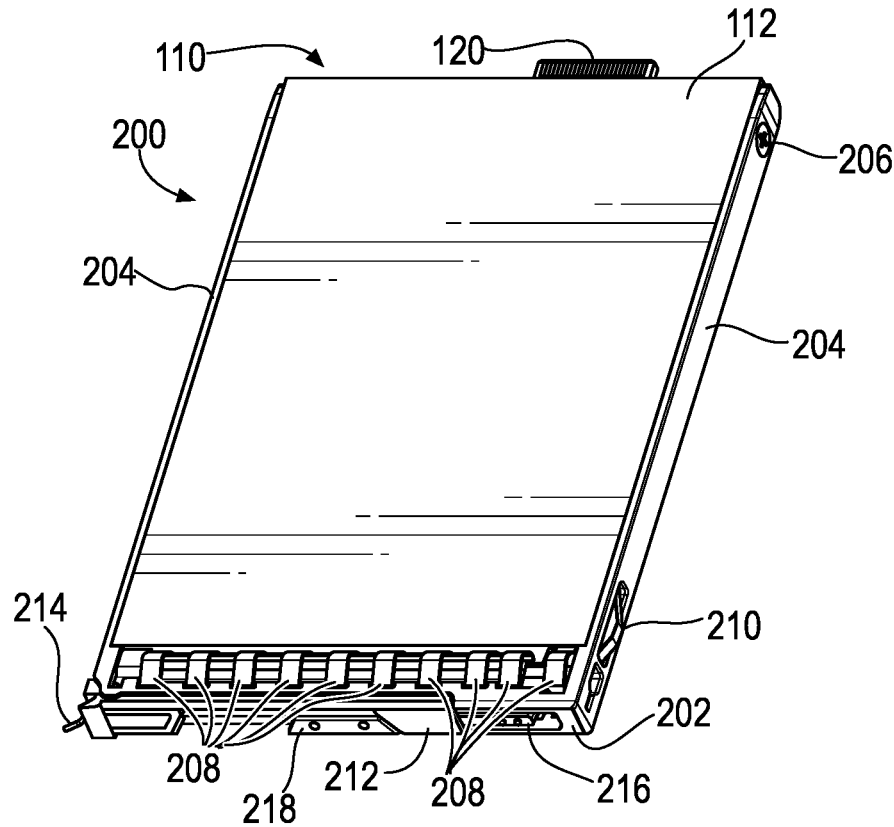
FIG. 3A is a front isometric view illustrating the adaptable carrier of FIG. 2 having the SSD of FIG. 1B installed therein.

FIG. 3A is a front isometric view illustrating adaptable carrier 200 from FIG. 2 having SSD 110 from FIG. 1B installed therein. As shown in FIG. 3A, SSD volume 112 of SSD 110 extends between side structures 204 of adaptable carrier 200, and SSD 110 may be secured within adaptable carrier 200 by screws 206 (only one shown) through side structures 204.

Figure 3B:
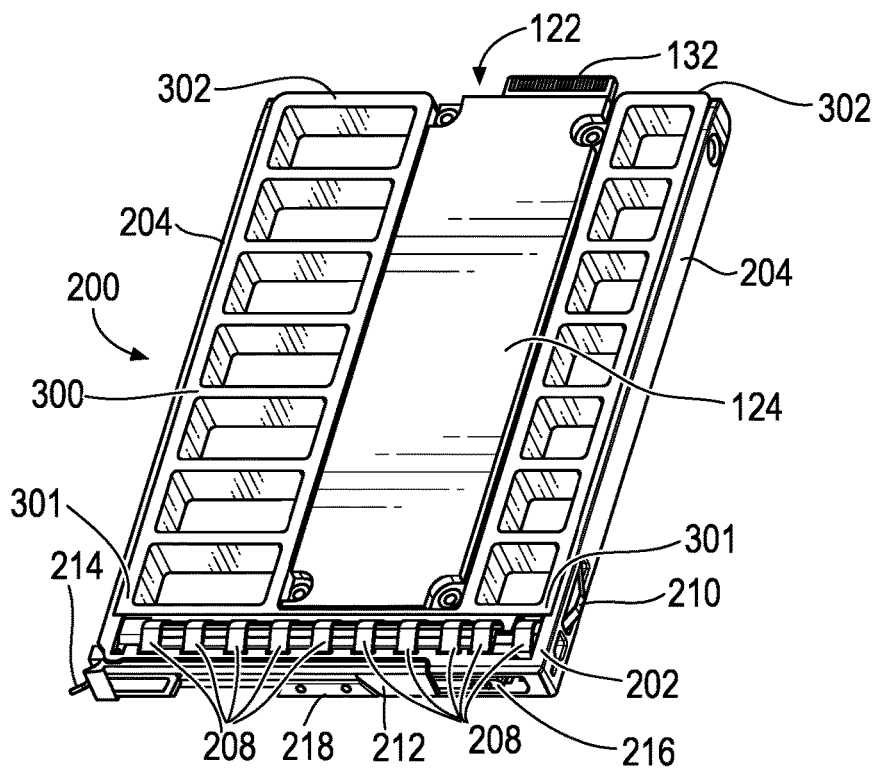
FIG. 3B is a front isometric view illustrating the adaptable carrier of FIG. 2 having an adaptor according to one or more examples and the SSD of FIG. 1C installed therein.

FIG. 3B is a front isometric view illustrating adaptable carrier 200 from FIG. 2 having SSD 122 from FIG. 1C installed therein. In the example of FIG. 3B, an adaptor 300 is provided to conform adaptable carrier 200 to volume 124 of SSD 122 between side structures 204 of adaptable carrier 200. In this example, adaptor 300 extends from a front end 301 disposed directly behind front structure 202 of adaptable carrier 200 to a rear end 302. In examples, adaptor 300 may be made of plastic, polycarbonate, metal, other suitably rigid materials, and is configured to receive SSD 122 therein in a position which positions card edge connector 132 appropriately for installation in a compute system.

Figure 3C:
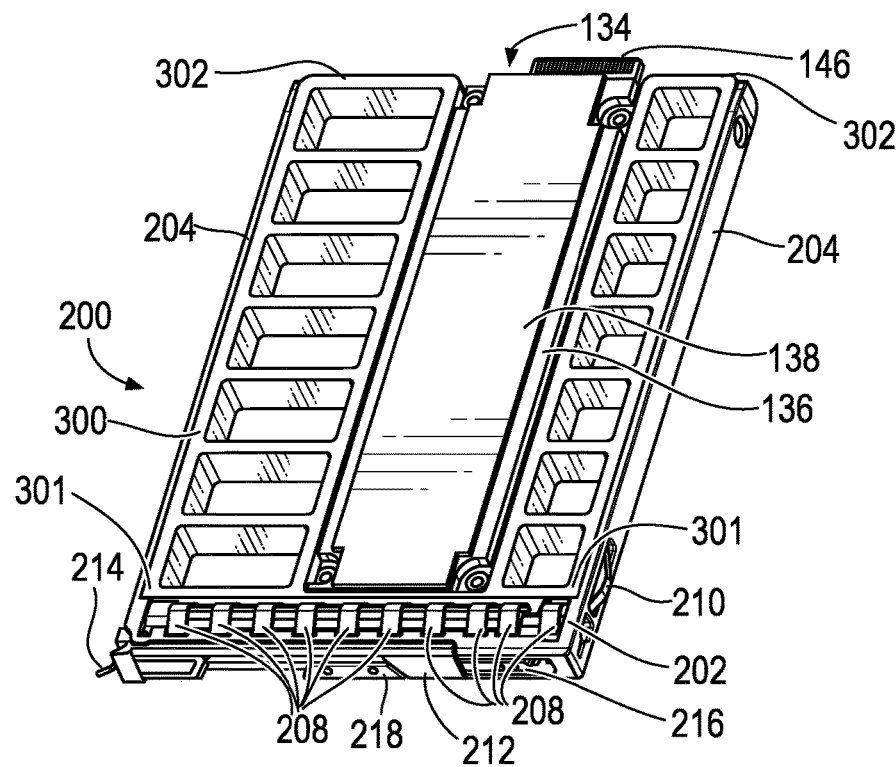
FIG. 3C is a front isometric view illustrating the adaptable carrier of FIG. 2 having the adaptor of FIG. 3B and the SSD of FIG. 1D installed therein.

FIG. 3C is a front isometric view illustrating adaptable carrier 200 from FIG. 2 having SSD 134 from FIG. 1D installed therein. In the example of FIG. 3C, adaptor 300 from FIG. 3B is provided to contain the SSD volume 136 of SSD 134 and the heat sink volume 138 of SSD 134 between side structures 204 of adaptable carrier 200.

Figure 4:
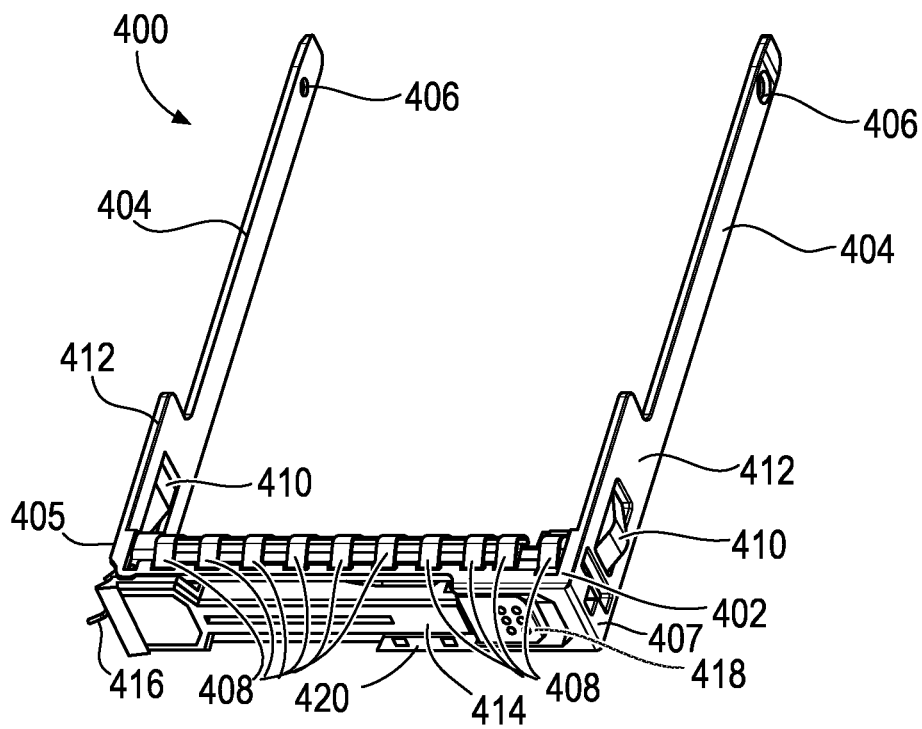
FIG. 4 is a front isometric view illustrating another adaptable carrier for SSDs of a plurality of different form factors according to one or more examples.

FIG. 4 is a front isometric view illustrating an adaptable carrier 400 according to another example for facilitating the installation of any of a plurality SSDs of differing form factors into a compute system. As shown in FIG. 4, adaptable carrier 400 includes a front structure 402 having a first side structure 404 extending perpendicularly from a first end 405 thereof and a second side structure 404 extending perpendicularly from a second end 407 thereof, forming a substantially U-shaped structure with squared corners. Side structures 404 may each have a screw hole 406 therein to allow for attachment of adaptable carrier 400 to an SSD or an SSD adaptor, as herein described. A plurality of spring clips 408 may be provided on front structure 402 for securing adaptable carrier 400 in a compute system (not shown in FIG. 4). Side spring clips 410 may be provided in side structures 404 for further securing adaptable carrier 400 within a compute system.

In this example, front structure 402 of adaptable carrier 400, as well as at least a front portion 412 of each side structure 404 may have a greater height dimension than corresponding front structure 202 and side structures 204 of the adaptable carrier 200 from the example of FIG. 2. As described herein, the greater height dimensions of front structure 402 and side structures 404 of adaptable carrier 400, relative to the height dimensions of front structure 202 and side structures 204 of adaptable carrier 200 from the example of FIG. 2, facilitate installation into adaptable carrier 400 of SSDs having correspondingly greater height dimensions than those installable in adaptable carrier 200 from the example of FIG. 2.

Front structure 402 may further include a hinged handle 414 biased with a spring 416 to swivel forward upon depression of a handle release button 418. Once swiveled open, hinged handle 414 facilitates removal of adaptable carrier 400 from a compute system. In various examples, front structure 402 may also include an indicator light bezel 420, described herein in further detail, for exposing indicator lights reflecting operation of an installed SSD to be visible at the front of adaptable carrier 400. In particular, as herein described, in some examples, front structure 402 may contain a light pipe assembly (not shown in FIG. 4) for directing light from indicator lights on an installed SSD through front structure 402 and indicator light bezel 420.

Figure 5A:
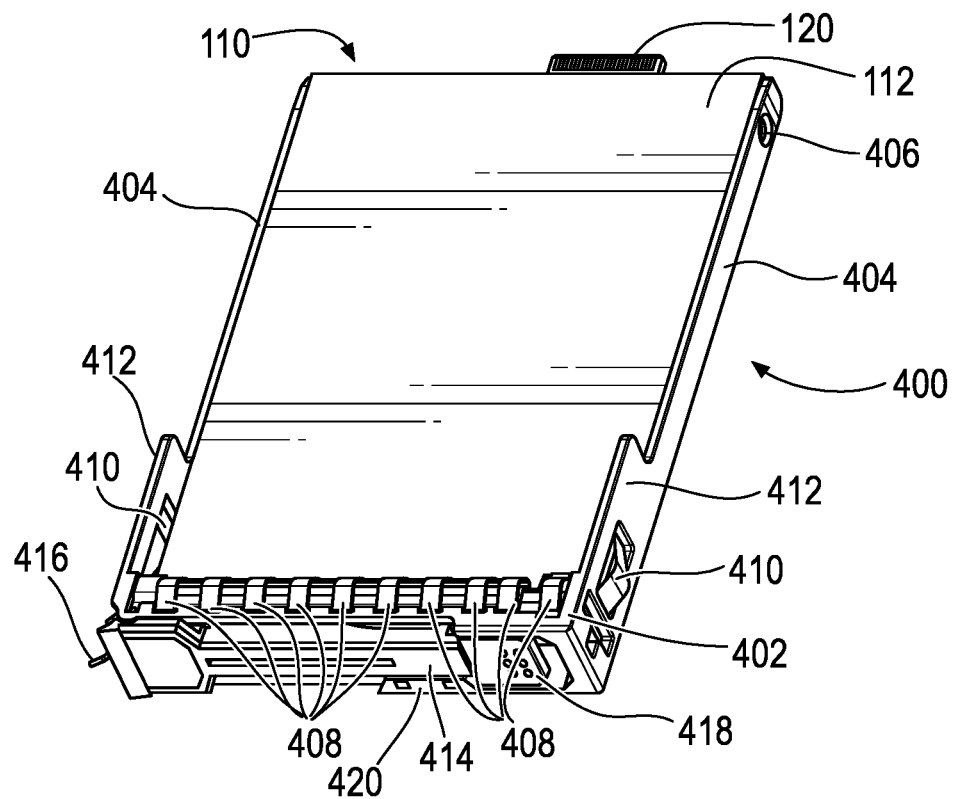
FIG. 5A is a front isometric view illustrating the adaptable carrier of FIG. 4 having the SSD of FIG. 1B installed therein.

FIG. 5A is a front isometric view illustrating adaptable carrier 400 from FIG. 4 having SSD 110 from FIG. 1B installed therein. As shown in FIG. 5A, SSD volume 112 of SSD 110 extends between side structures 404 of adaptable carrier 400, and SSD 110 may be secured within adaptable carrier 200 by screws through screw holes 406 in side structures 404.

Figure 5B:
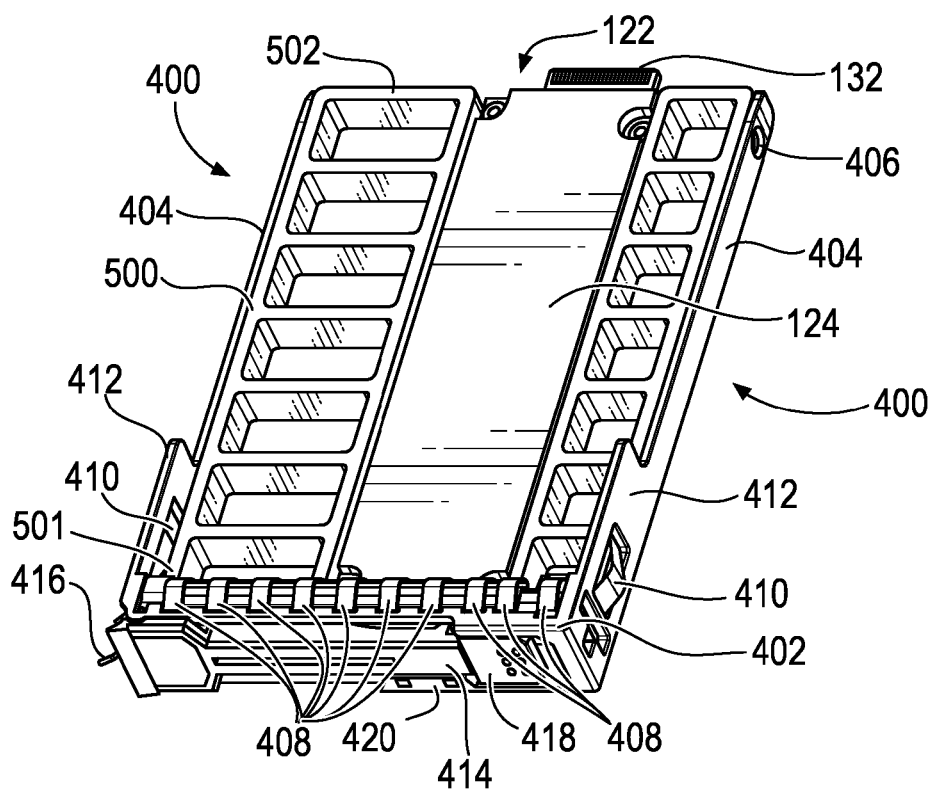
FIG. 5B is a front isometric view illustrating the adaptable carrier of FIG. 4 having an adaptor according to one or more examples and the SSD of FIG. 1C installed therein.

FIG. 5B is a front isometric view illustrating adaptable carrier 400 from FIG. 4 having SSD 122 from FIG. 1C installed therein. In the example of FIG. 5B, an adaptor 500 is provided to conform adaptable carrier 400 to volume 124 of SSD 122 between side structures 404 of adaptable carrier 400. In this example, adaptor 500 extends from a front end 501 disposed directly behind front structure 402 of adaptable carrier 400 to a rear end 502. In examples, adaptor 500 may be made of plastic, polycarbonate, metal, other suitably rigid materials, and is configured to receive SSD 122 therein in a position which positions card edge connector 132 appropriately for installation in a compute system (not shown in FIG. 5B).

Figure 5C:
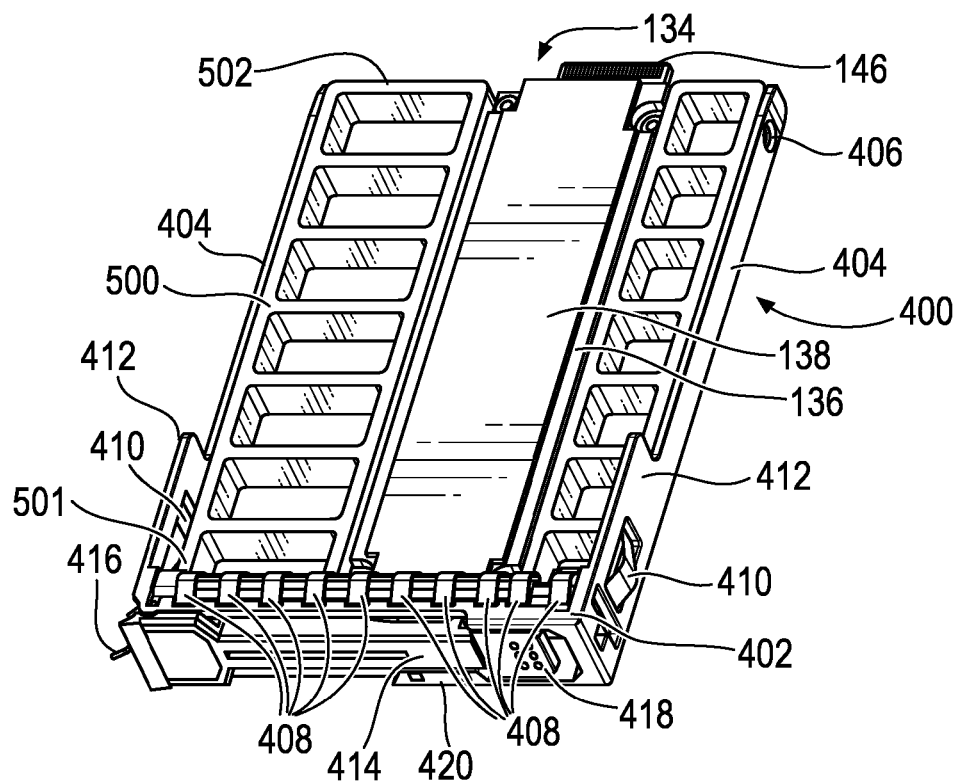
FIG. 5C is a front isometric view illustrating the adaptable carrier of FIG. 4 having the adaptor of FIG. 5B and the SSD of FIG. 1F installed therein.

FIG. 5C is a front isometric view illustrating adaptable carrier 400 from FIG. 4 having SSD 134 from FIG. 1D installed therein. In the example of FIG. 5C, adaptor 500 from FIG. 5B is provided to conform adaptable carrier 400 to volume 136 of SSD 134 and the heat sink volume 138 of SSD 134 between side structures 404 of adaptable carrier 400.

Figure 5D:
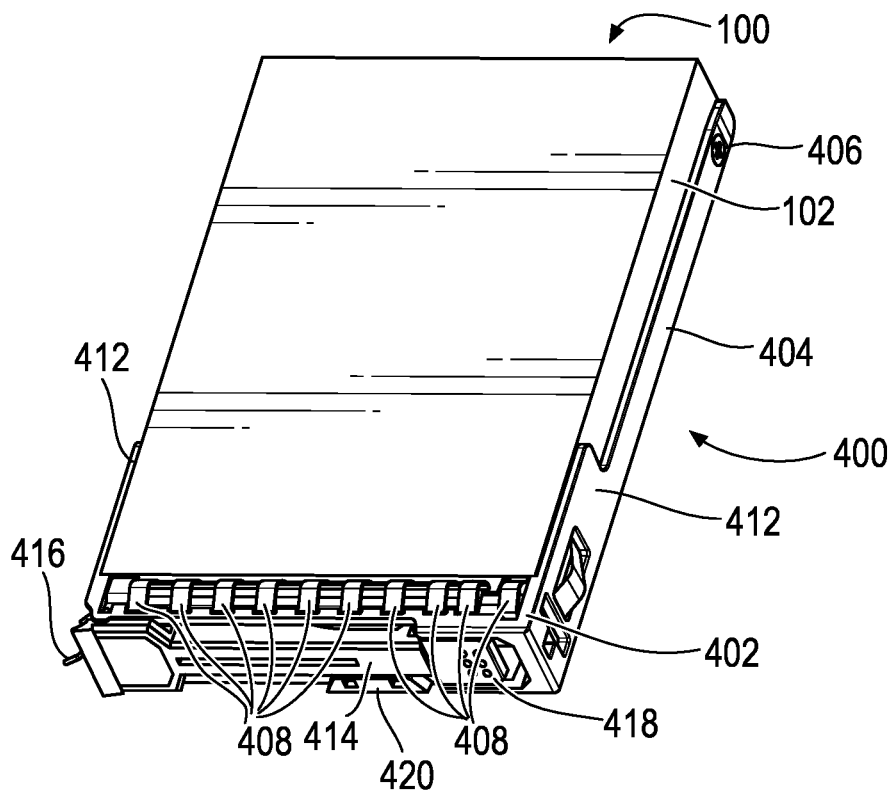
FIG. 5D is a front isometric view illustrating the adaptable carrier of FIG. 4 having the SSD of FIG. 1A installed therein.

FIG. 5D is a front isometric view illustrating adaptable carrier 400 from FIG. 4 having SSD 100 from FIG. 1A installed therein. As shown in FIG. 5D, SSD volume 102 of SSD 100 extends between side structures 404 of adaptable carrier 400, and SSD 100 may be secured within adaptable carrier 200 by screws through screw holes 406 in side structures 404.

Figure 5E:
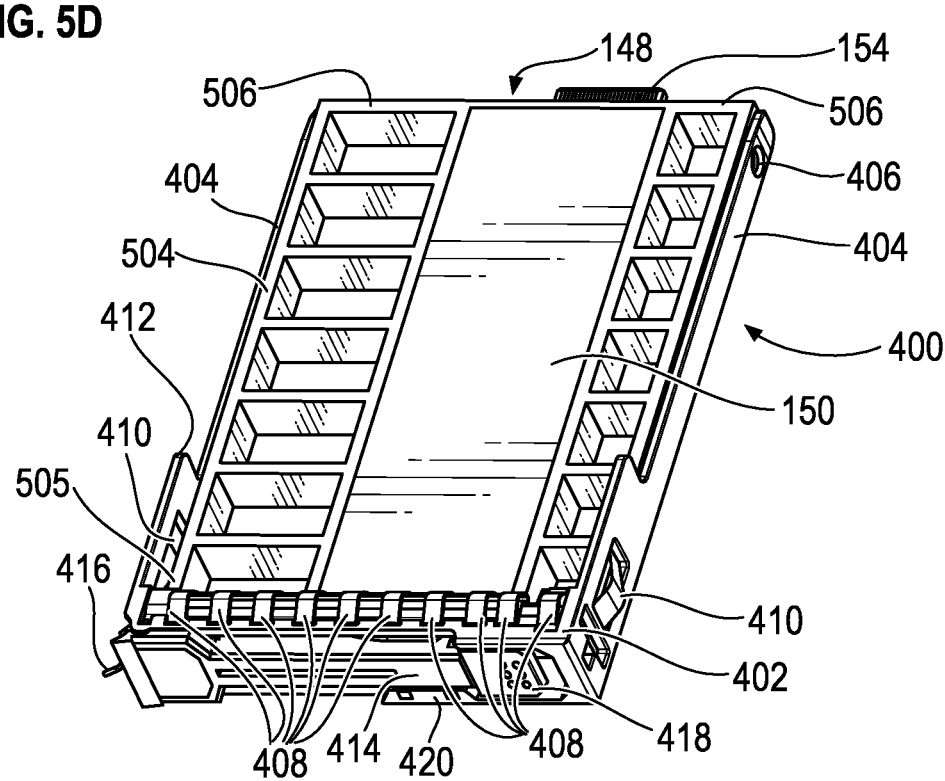
FIG. 5E is a front isometric view illustrating the adaptable carrier of FIG. 4 having an adaptor according to one or more examples and the SSD of FIG. 1E installed therein.

FIG. 5E is a front isometric view illustrating adaptable carrier 400 from FIG. 4 having SSD 148 from FIG. 1E installed therein. In the example of FIG. 5B, an adaptor 504 is provided to conform adaptor 400 to volume 124 of SSD 122 between side structures 404 of adaptable carrier 400. In this example, adaptor 504 extends from a front end 505 disposed directly behind front structure 402 of adaptable carrier 400 to a rear wall 506. In this example, adaptor 502 has different dimension than adaptor 500 from the examples of FIGS. 5B and 5C, due to the different width dimension of SSD 148 relative to SSDs 122 and 134 in the examples of FIGS. 5B and 5C. In examples, adaptor 502 may be made of plastic, polycarbonate, metal, other suitably rigid materials, and is configured to receive SSD 148 therein in a position which positions card edge connector 154 appropriately for installation in a compute system (not shown in FIG. 5E).

Figure 5F:
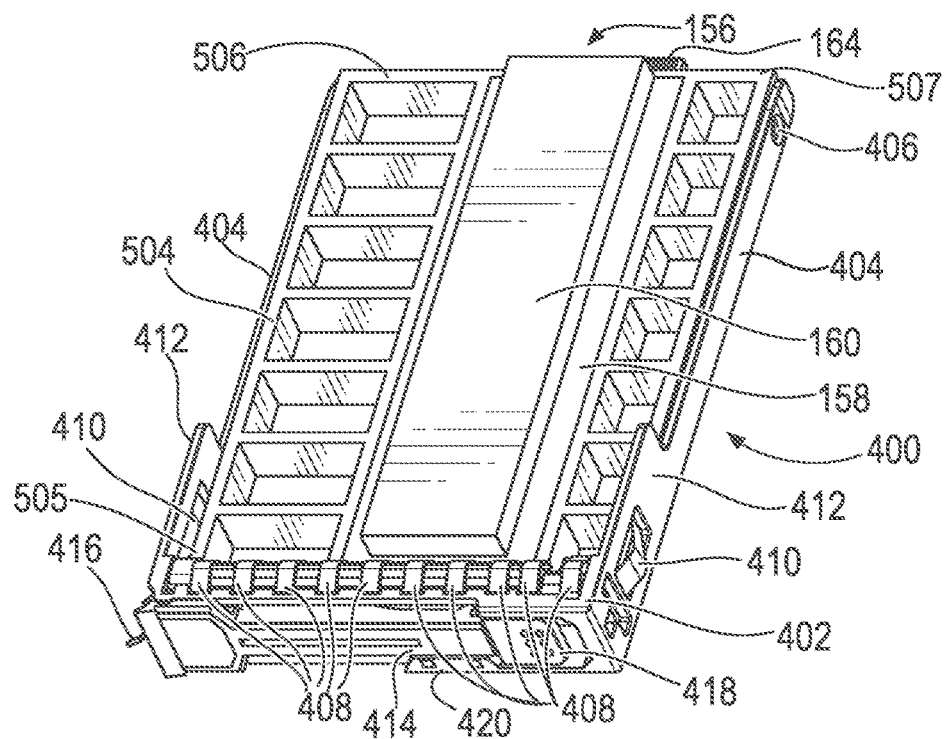
FIG. 5F is a front isometric view illustrating the adaptable carrier of FIG. 4 having the adaptor of FIG. 5E and the SSD of FIG. 1F installed therein.

FIG. 5F is a front isometric view illustrating adaptable carrier 400 from FIG. 4 having SSD 156 from FIG. 1F installed therein. In the example of FIG. 5F, adaptor 502 from the example of FIG. 5E is provided to conform adaptable carrier 400 to volume 158 of SSD 156 and the heat sink volume 160 of SSD 122 between side structures 404 of adaptable carrier 400. In this example, adaptor 502 is configured to receive SSD 156 therein in a position which positions card edge connector 164 appropriately for installation in a compute system (not shown in FIG. 5F).

Figure 5G:
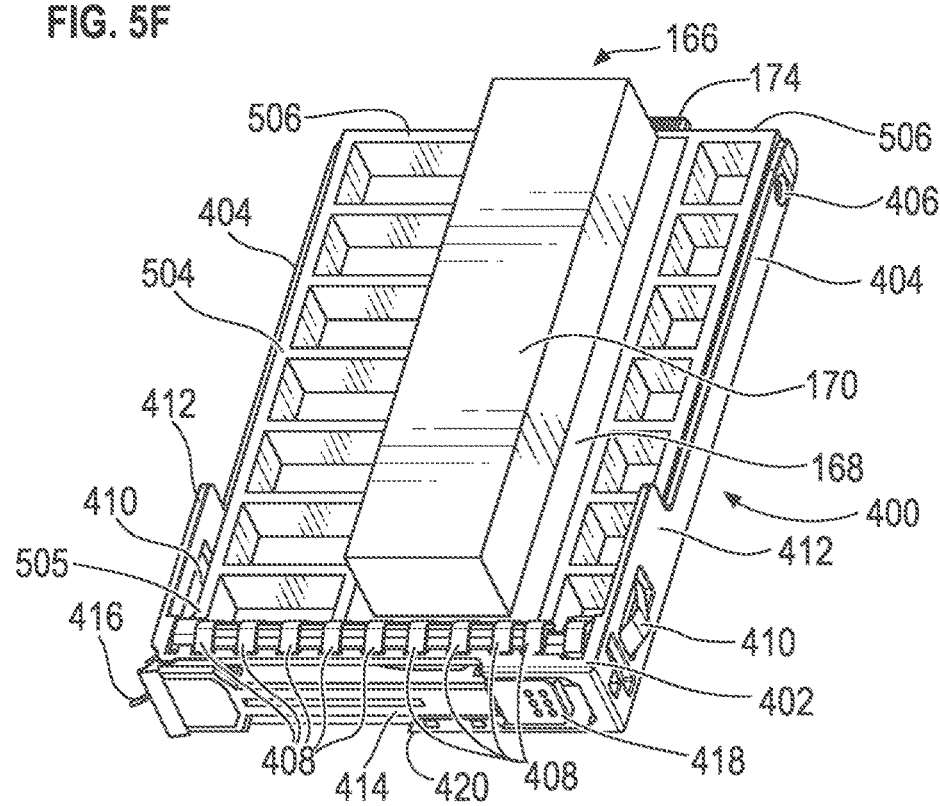
FIG. 5G is a front isometric view illustrating the adaptable carrier of FIG. 4 having the adaptor of FIG. 5E and the SSDF of FIG. 1G installed therein.

FIG. 5G is a front isometric view illustrating adaptable carrier 400 from FIG. 4 having SSD 166 from FIG. 1G installed therein. In the example of FIG. 5G, adaptor 502 from the example of FIG. 5E is provided to conform adaptor 400 to volume 168 of SSD 166 between side structures 404 of adaptable carrier 400. In this example, heat sink volume 170 of SSD 166 extends above the height dimension of adaptable carrier 400. In this example, adaptor 502 is configured to receive SSD 166 therein in a position which positions card edge connector 174 appropriately for installation in a compute system (not shown in FIG. 5G).

As described above, in various examples, an adaptable carrier may include a front structure including an indicator light bezel for exposing indicator lights from an SSD installed in the adaptable carrier. As further described above, in some examples, a front structure of an adaptable carrier may include a light pipe assembly for directing light from indicator LEDs of an installed SSD through the front structure and indicator light bezel.

As described with reference to FIGS. 1A-1G, SSDs conforming to SNIA EDSFF E1.S and E3.S specifications have indicator LEDs positioned in differing locations. In particular, SSDs conforming to the E1.S specification, such as the SSDs 122, 134, 148, 156, and 166 of FIGS. 1C-1G, respectively, each have two indicator lights (Attention/Error and Power/Activity) disposed side-by-side in the thickness dimension of the SSD, while SSDs conforming to the E3.S specification have two indicator LEDs (Status and Fault/Locate) disposed side-by-side in the width dimension of the SSD. Moreover, the two indicator LEDs of E1.S SSDs are spaced more closely together than the SSDs of E3.S SSDs. In some examples herein, therefore, a light pipe assembly may be provided in an adaptable carrier to accommodate both E1.S and E3.S indicator LED placement, and to increase the spacing between the indicator LEDs of E1.S SSDs. An example of a light pipe assembly and its incorporation into an adaptable carrier according to one or more examples is described herein with reference to FIGS. 6-10.

Figure 6:
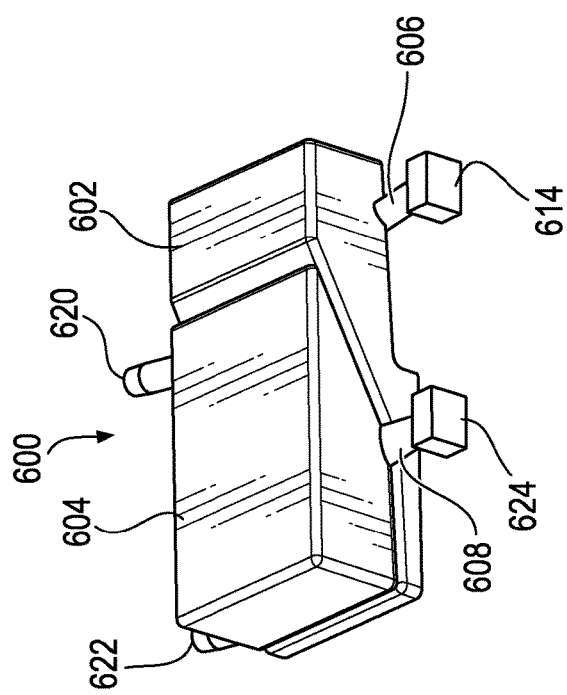
FIG. 6 is a is a front isometric view illustrating a light pipe carrier structure according to one or more examples.

In particular, FIG. 6 illustrates a light pipe assembly 600 according to one or more examples including a pair of light pipes 606 and 608 supported by a housing including a first housing component 602 engaged with a second housing component 604. Light pipe assembly 600 may be incorporated into a front structure of an SSD carrier, such as front structure 202 of adaptable carrier 200 or front structure 402 of adaptable carrier 400. In various examples, light pipe assembly 600 is incorporated into front structure 202 of adaptable carrier 200, and in other examples, light pipe assembly 600 is incorporated into front structure 402 of adaptable carrier 400. In examples, light pipe assembly 600 is positioned such that light pipes 606 and 608 may redirect light from indicator LEDs of an either E1.S or E3.S SSDs installed in an adaptable carrier such as adaptable carrier 200 or adaptable carrier 400 to a front face of the adaptable carrier. First housing component 602 and second housing component 604 of light pipe assembly 600 may be made of plastic, and light pipes 606 and 608 may be made of a light-conducting material, such as clear plastic, polycarbonate, or glass.

Figure 7:
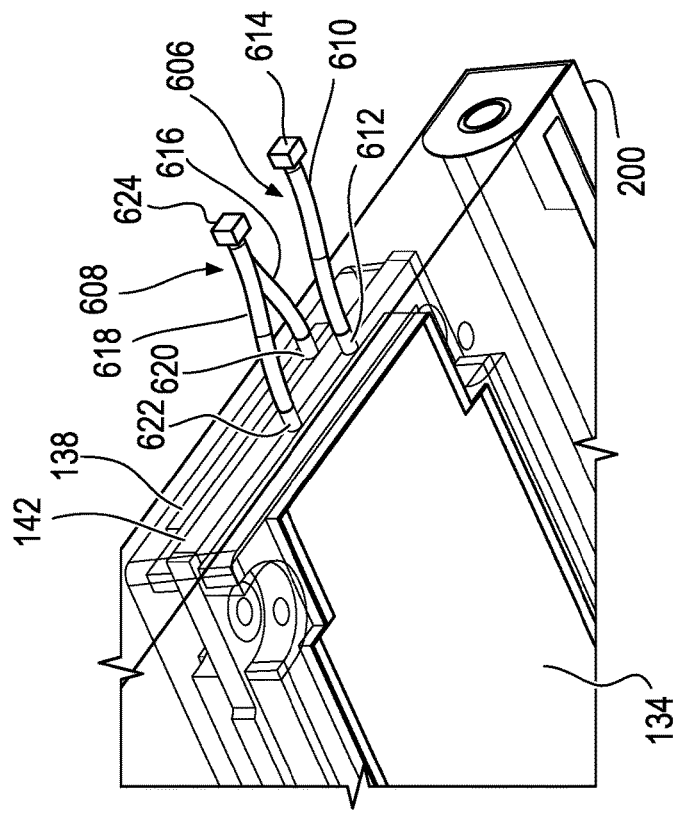
FIG. 7 is a partially front isometric view illustrating a portion of the adaptable carrier of FIG. 2 with a pair of light pipes oriented in front of an installed SSD.
Figure 8:
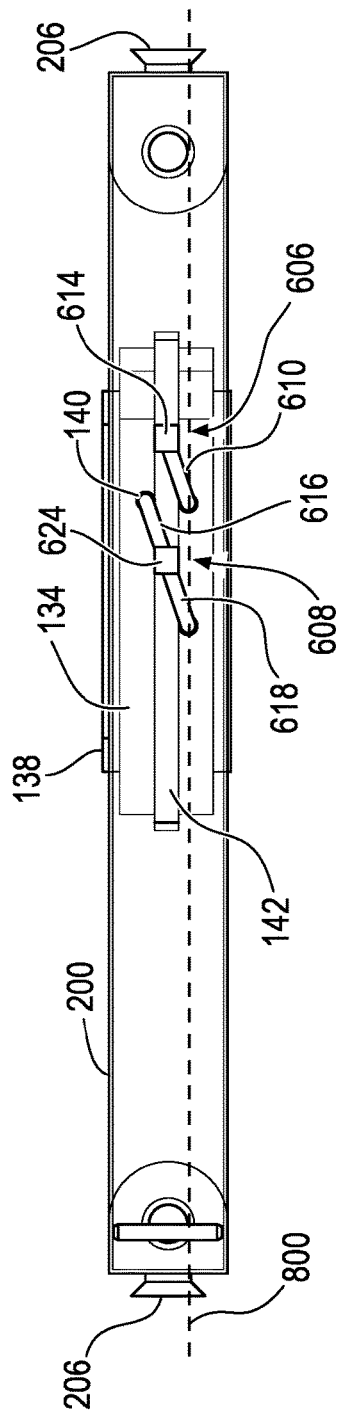
FIG. 8 is a partial front view illustrating the adaptable carrier of FIG. 2 and the pair of light pipes from FIG. 7 oriented in front of an installed SSD.

FIG. 7 is a partial isometric front view of adaptable carrier 200 from FIG. 2 with SSD 134 from FIG. 1D and FIG. 3C installed therein as shown in FIG. 3C. FIG. 8 is a partial front view of adaptable carrier 200 from FIG. 2 with SSD 135 from FIG. 1D and FIG. 3C installed therein as shown in FIG. 3C. FIGS. 7 and 8 further show light pipes 606 and 608 positioned at the front of SSD 134. For the purposes of illustration, neither front structure 202 of adaptable carrier 200 nor light pipe carrier 600 is shown in FIGS. 7 and 8, in order for FIGS. 7 and 8 to illustrate the position of light pipes 606 and 608 as supported by light pipe carrier 600 relative to SSD 134 in adaptable carrier 200. In the example of FIGS. 6-10, first light pipe 606 has a single elongate light conductor portion 610 extending between a light receiving end 612 and a light transmitting end 614. Second light pipe 608 has a generally Y-shaped configuration including first and second elongate light conductors 616 and 618 extending between separate light receiving ends 620 and 622, respectively and a common light transmitting end 624.

In the example of FIGS. 6-10, first and second light pipes 606 and 608 as supported within carrier structure 600 are configured to be compatible with the indicator LED positioning of both E1.S SSDs and E3.S SSDs. In particular, light receiving end 612 of first light pipe 606 and first light receiving end 620 of second light pipe 608 are oriented to be proximal to the indicator LEDs of E1.S SSDs, while light receiving end 612 of first light pipe 606 and second light receiving end 622 of second light pipe 608 are oriented to be proximal to the indicator LEDs of E3.S SSDs. Thus, regardless of whether an adaptable carrier according to examples herein has an E1.S SSD or and E3.S SSD installed therein, first light pipe 606 with a single elongate light conductor portion 610 and second light pipe 608 with two elongate light conductor portions 616 and 618 merging in a Y-configuration to a common light transmitting end 624 in combination are adapted to redirect light from the indicator LEDs of the SSD to their respective light transmitting ends 614 and 624. Further, the spacing and orientation of light transmitting ends 614 and 624 on a front face of an adaptable carrier is the same regardless of whether an E1.S or E3.S SSD is installed. In particular, in examples, light transmitting ends 614 and 624 are spaced further apart than the indicator LEDS of E1.S SSDs.

Figure 9:
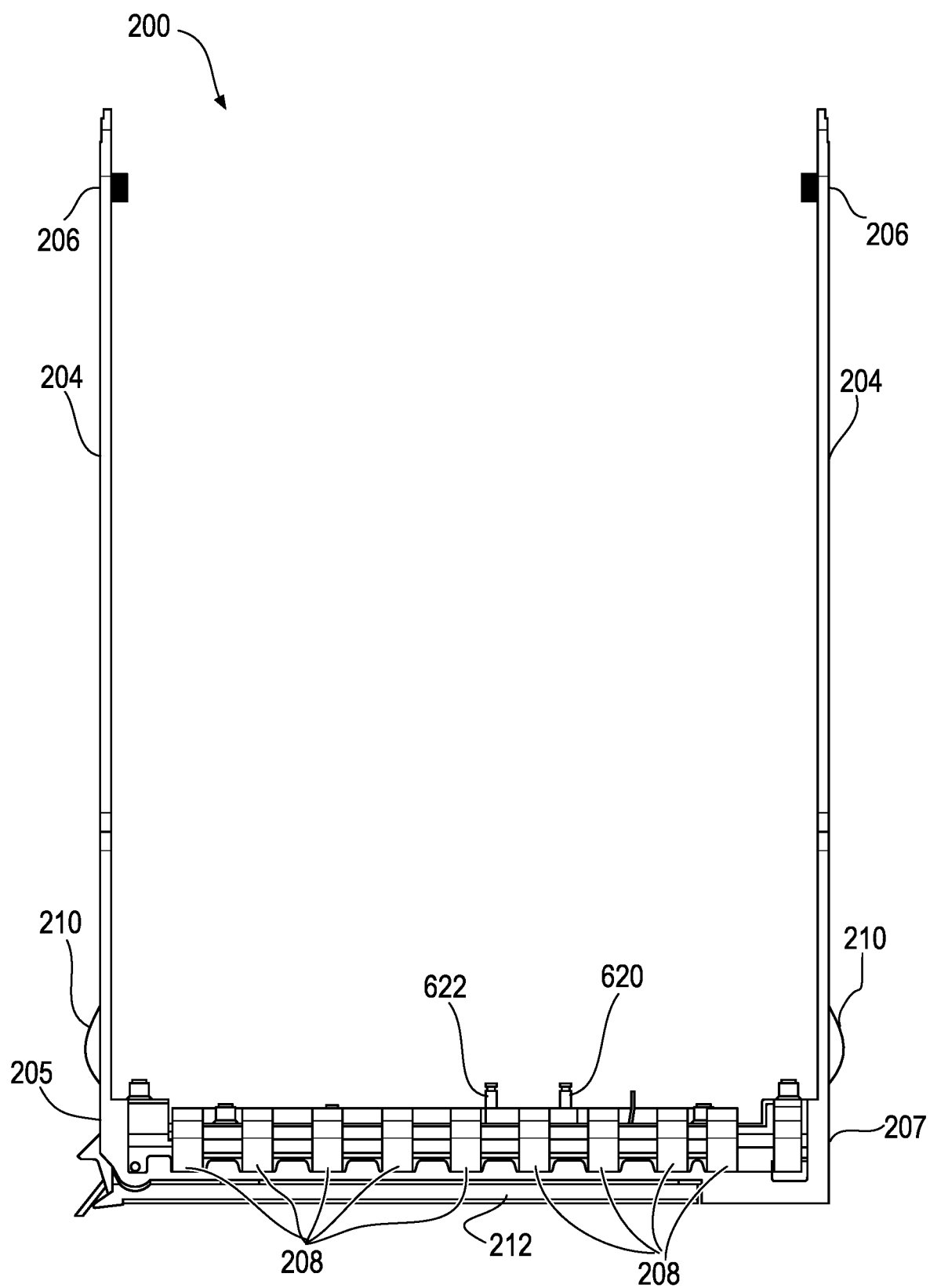
FIG. 9 is a top view illustrating the adaptable carrier of FIG. 2 and the light receiving ends of the pair of light pipes from FIG. 7.
Figure 10:
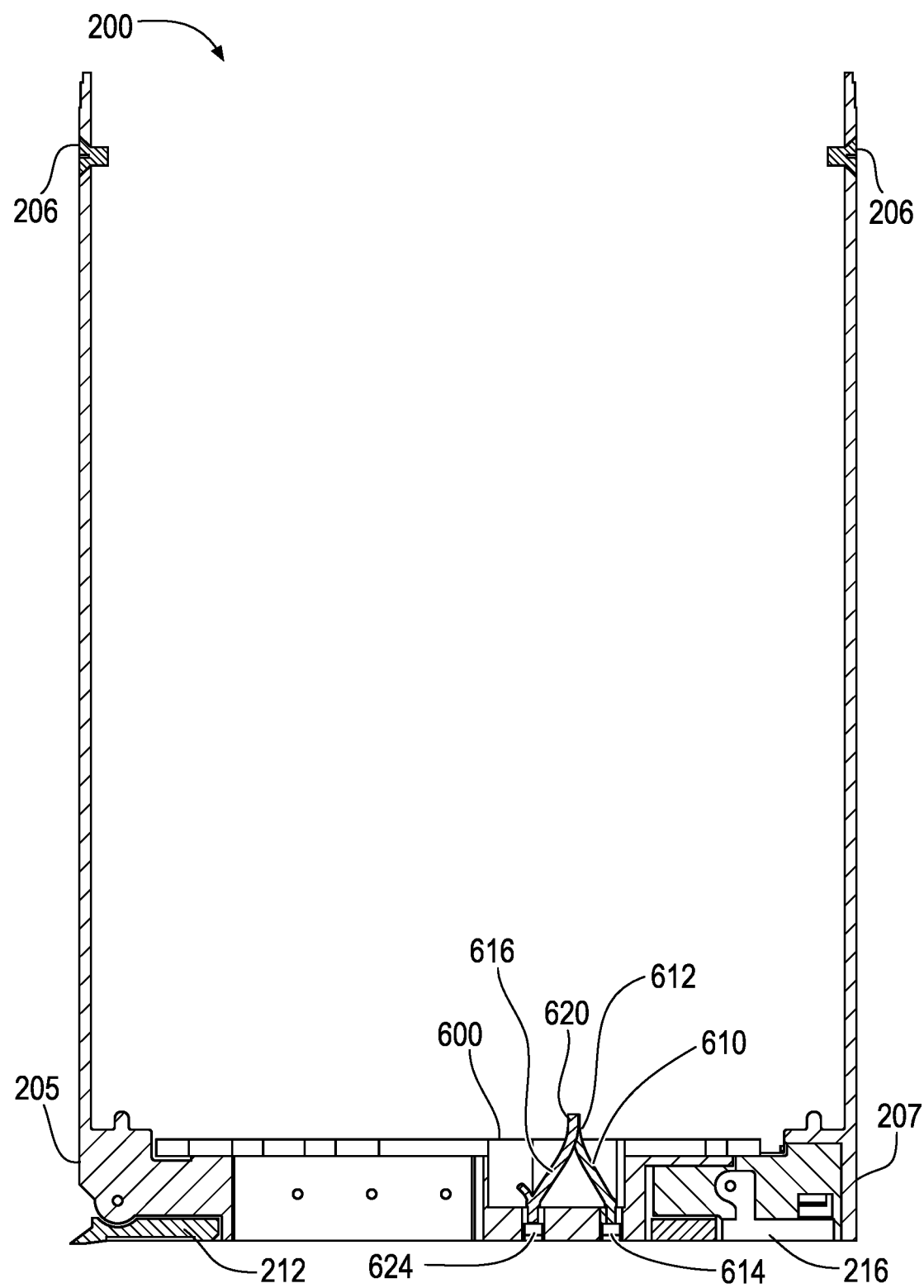
FIG. 10 is a top cross-sectional view illustrating the adaptable carrier of FIG. 2 and portions of the light pipes from FIG. 7.

FIG. 9 is a top view illustrating adaptable carrier 200 from FIG. 2 and showing the positions of receiving end 620 of light pipe 606 and one light receiving end 624 of light pipe 608. FIG. 10 is a cross-sectional view illustrating adaptable carrier 200 from FIG. 2 at a cross-sectional location indicated by dashed line 800 in FIG. 8. FIG. 10 shows that light receiving end 612 of elongate light conductor portion 610 light pipe 606 and the light receiving end 620 of the first elongate light conductor 616 of light pipe 608 are in vertical (thickness) alignment in order to be positioned proximal to LED indicators of E1.S SSDs which may be installed in adaptable carrier 200.

Figure 11:
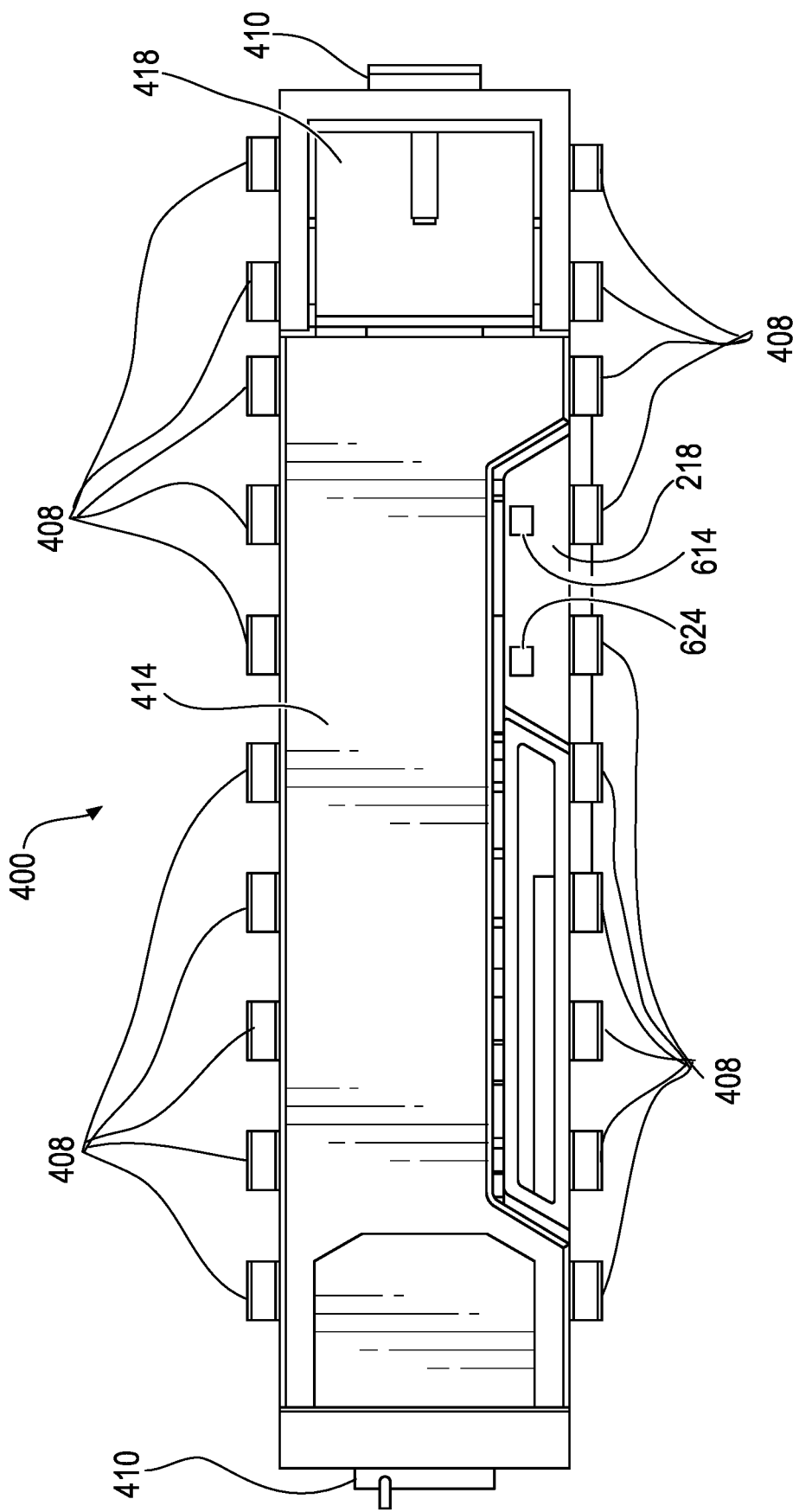
FIG. 11 is a front view illustrating the adaptable carrier of FIG. 4.

FIG. 11 is a front view illustrating adaptable carrier 400 from FIG. 4 and showing light transmitting ends 614 and 624 of respective first and second light pipes 606 and 608 exposed through indicator light bezel 218 of adaptable carrier 400. While adaptable carrier 400 may have either E1.S or E3.S SSDs installed therein, as described herein with reference to FIGS. 5A-5G, the position of light transmitting ends 614 and 624 is the same within light bezel 218, due to the configuration of first and second light pipes 606 and 608.

Figure 12:
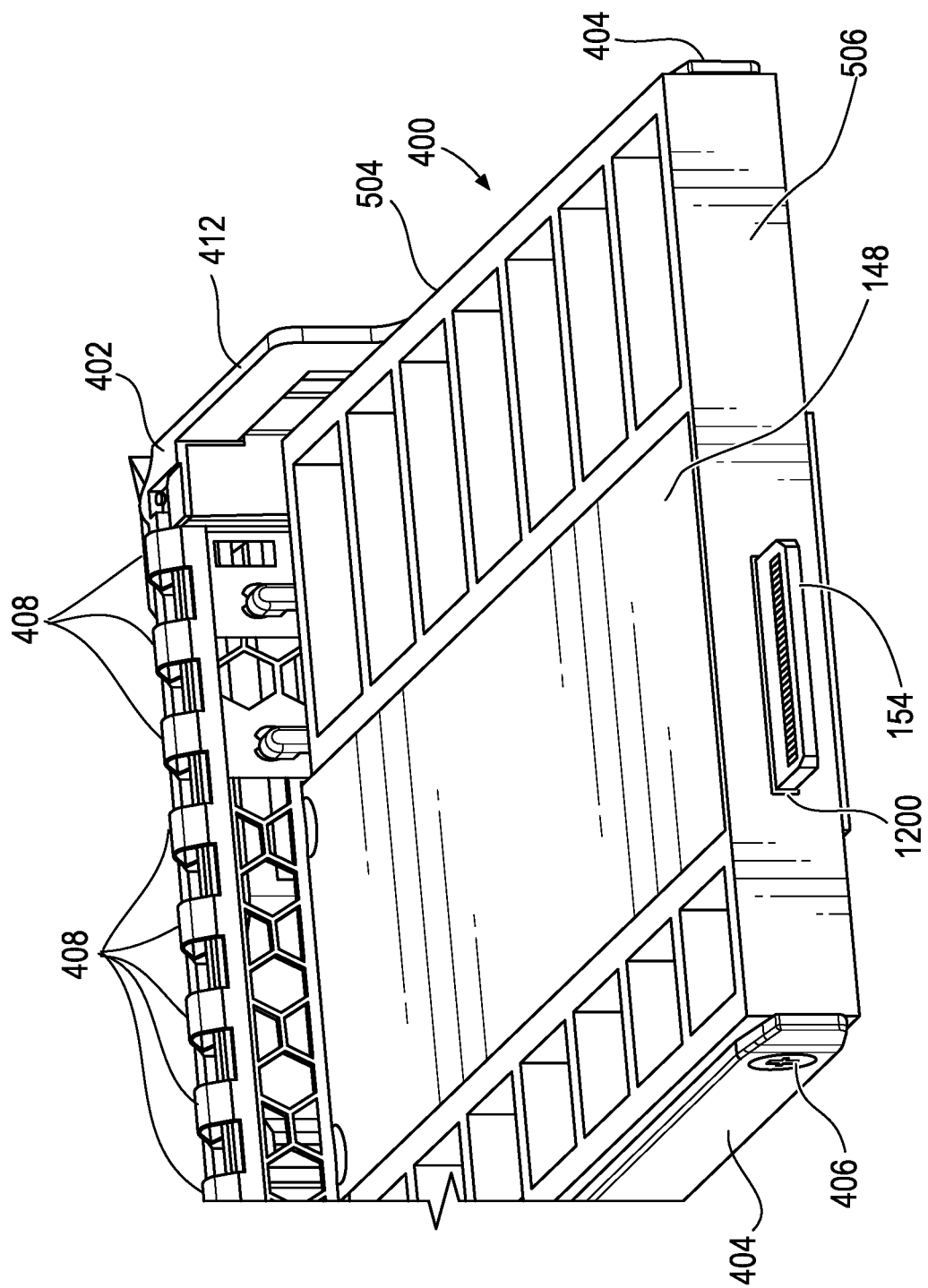
FIG. 12 is a rear isometric view illustrating the adaptable carrier of FIG. 4 including an adaptor for an E1.S SSD.

FIG. 12 is a rear isometric view illustrating adaptable carrier 400 with an E1.S SSD such as SSD 148 from the example of FIG. 1E installed therein. To accommodate SSD 148, adaptable carrier is equipped with adaptor 504 previously described with reference to FIG. 5E. As shown in FIG. 12, adaptor 504 includes a rear wall 506 having an aperture 1200 through which card edge connector 154 of SSD 148 extends. In this example, SSD 148 is supported at its front end by front structure 402 of adaptable carrier 400, and at its rear end by card edge connector 154 passing through aperture 1200 in rear wall 506 of adaptor 504.

Figure 13A:
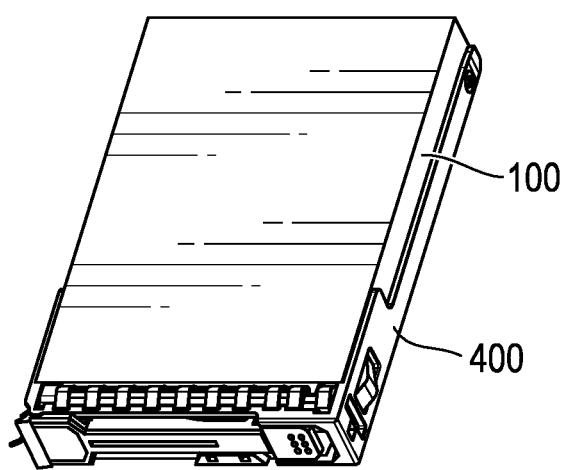
FIG. 13A is an isometric view illustrating the adaptable carrier of FIG. 4 having an SSD installed therein.
Figure 13B:
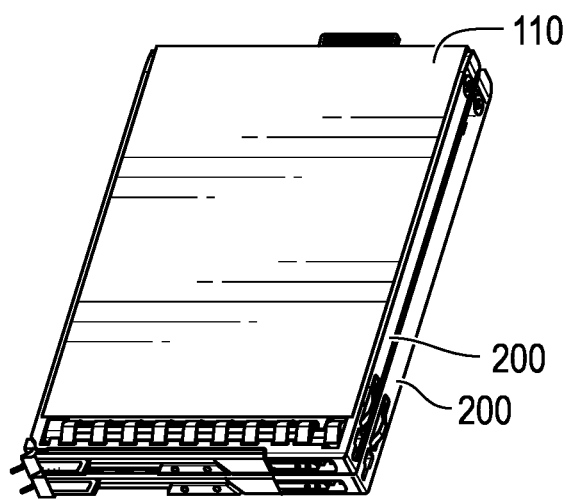
FIG. 13B is an isometric view illustrating a stack of two adaptable carriers of FIG. 2 having SSDs installed therein.

FIG. 13A is an isometric view illustrating a single adaptable carrier 400 from the example of FIG. 4 with an E3.S 2T SSD such as SSD 100 from the example of FIG. 1A installed therein. FIG. 13B is an isometric view illustrating a pair of adaptable carriers 200 from the example of FIG. 2 each having an E1.S SSD such as SSD 110 from the example of FIG. 1B installed therein. (Only the top SSD 110 is visible in the view of FIG. 13B.) As is evident from FIGS. 13A and 13B, in some examples, the thickness of a single adaptable carrier 400 as shown in FIG. 13A and a stack of two adaptable carriers 200 as shown in FIG. 13B are equivalent.

Figure 14:
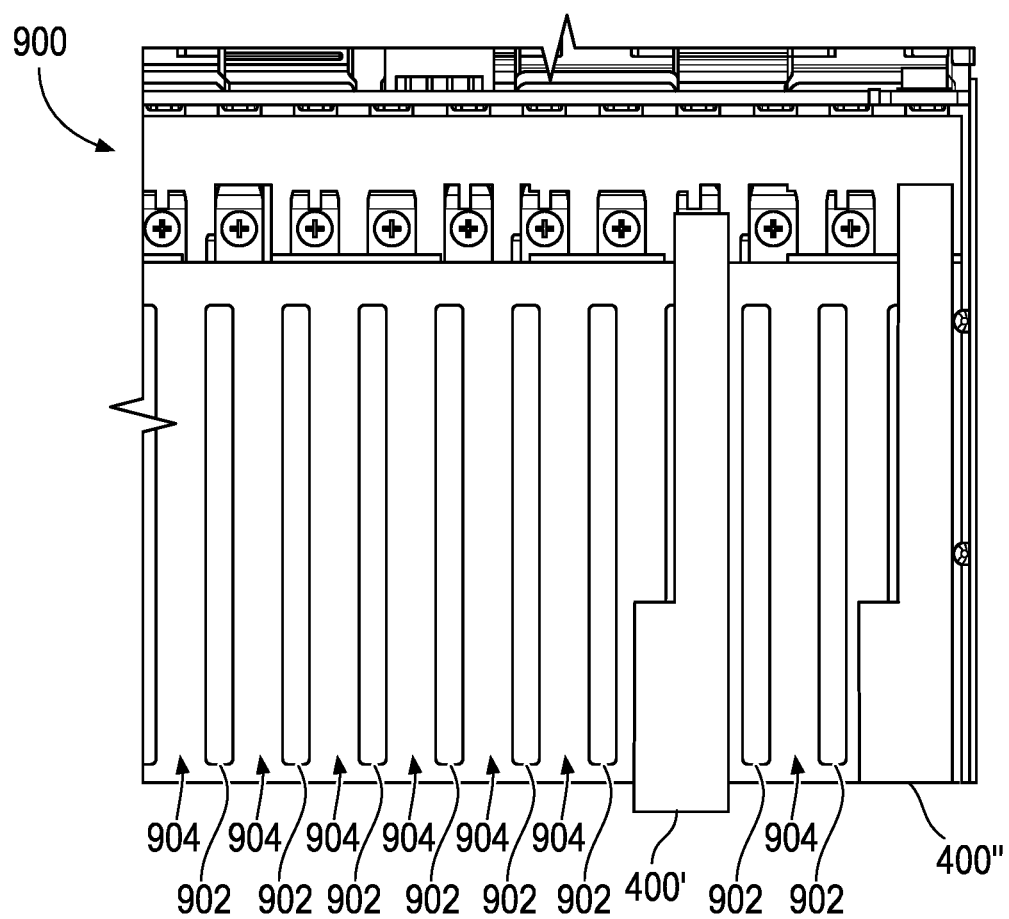
FIG. 14 is a top view of a compute system rack having bays for installation of compute system components according to one or more examples.

FIG. 14 is a top view of a compute system rack 900 having a plurality of rails 902 therein. Rails 902 define a plurality of bays 904 in compute system rack 900 for receiving compute system components such as adaptable carriers 200 and 400 from the foregoing examples. In examples, a bay 904 may be adapted to receive a single adaptable carrier 200 therein, while two bays 904 may be filed by a single adaptable carrier 400. In the example of FIG. 14, a first adaptable carrier 400' is shown partially inserted into compute system rack 900, and a second adaptable carrier 400" is shown fully inserted compute system rack 900.

Figure 15:
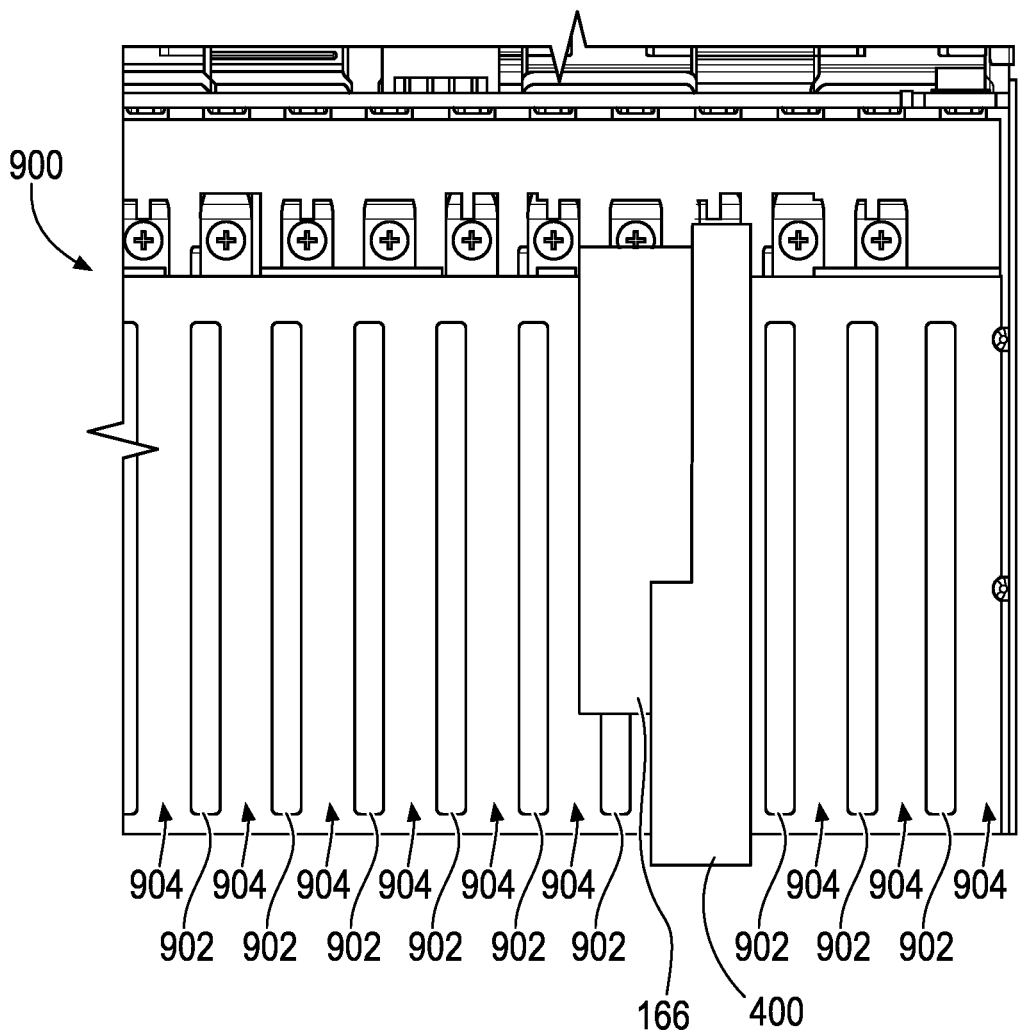
FIG. 15 is a top view of the compute system rack of FIG. 14.

FIG. 15 is a top view of compute system rack 900 from the example of FIG. 14 and showing a partially inserted adaptable carrier 400 with an E1.S SSD 166 and an adapter 502 installed therein, as shown in FIG. 5G. In this example, adaptable carrier and SSD 166 occupy three bays 904 of compute system rack 900.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A solid-state drive (SSD) carrier, comprising:
   a front structure having a first end, a second end, a front face, and a rear face opposite the front face,
   a first side structure extending perpendicularly from the first end of the front structure,
   a second side structure extending perpendicularly from the second end of the front structure, wherein the front structure, the first side structure, and the second side structure are in conjunction configured to carry an SSD conforming to any one of a plurality of different SSD form factors, the SSD carrier configured to carry one SSD at a time; and
   a light pipe assembly comprising one or more light pipes extending through the front structure and configured to direct light from a plurality of light receiving ends positioned at the rear face of the front structure to one or more light transmitting ends positioned at the front face of the front structure,
   wherein the plurality of light receiving ends is arranged such that:
      a first subset of the light receiving ends is aligned with one or more indicator light-emitting diodes (LEDs) of a first SSD in a coupled state of the first SSD to the SSD carrier; and
      a second subset of the light receiving ends is aligned with one or more indicator LEDs of a second SSD in a coupled state of the second SSD to the SSD carrier; and wherein the first SSD and the second SSD have mutually different indicator LED arrangements.

2. The SSD carrier of claim 1, further comprising:
an adaptor for insertion between the first side structure and the second side structure to conform the SSD carrier to at least one of the plurality of different SSD form factors.

3. The SSD carrier of claim 1, wherein the one or more light pipes comprise a first light pipe comprising:
a first elongate light conductor extending between a first light receiving end of the plurality of light receiving ends and a first light transmitting end of the one or more light transmitting ends; and
a second elongate light conductor extending between a second light receiving end and the first light transmitting end,
wherein the first subset of light receiving ends comprises the first light receiving end, the second subset of light receiving ends comprises the second light receiving end, and the first light transmitting end is common to both the first and second elongate light conductors.

4. The SSD carrier of claim 3,
wherein the one or more light pipes comprise a second light pipe extending through the front structure and having an elongate light conductor extending between a third light receiving end of the plurality of light receiving ends and a second light transmitting end of the one or more light transmitting ends.

5. The SSD carrier of claim 4,
wherein the light pipe assembly comprises a light pipe carrier structure disposed in the front structure of the SSD carrier, the light pipe carrier structure supporting the first light pipe and the second light pipe such that:
the first subset of the light receiving ends comprises the first light receiving end of the first light pipe and the third light receiving end of the second light pipe, and
the second subset of the light receiving ends comprises the second light receiving end of the first light pipe and the third light receiving end of the second light pipe.

6. The SSD carrier of claim 2, wherein:
the SSD includes a card edge connector at the rear thereof; and
the adaptor includes a rear wall having an aperture therein for permitting passage of the card edge connector of the SSD therethrough.

7. The SSD carrier of claim 2, wherein the SSD carrier is configured for insertion in a bay of a compute system rack.

8. The SSD carrier of claim 2, wherein the SSD carrier is configured to occupy two bays of a compute system rack.

9. The SSD carrier of claim 3,
wherein the first SSD has a first SSD form factor of the plurality of SSD form factors, the first SSD form factor having a first indicator LED arrangement; and
wherein the second SSD has a second SSD form factor of the plurality of SSD form factors, the second SSD form factor having a second indicator LED arrangement.

10. A light pipe assembly, comprising:
a housing; and
one or more light pipes supported by the housing, each of the light pipes comprising:
one or more light receiving ends situated at a first side of the housing and a light transmitting end situated at a second side of the housing, and
one or more elongate light conductors extending respectively between the one or more light receiving ends and the light transmitting end, wherein each of the elongate light conductors is configured to conduct light from one of the light receiving ends to the light transmitting end;
wherein the light pipe assembly is configured to be installed in a device carrier configured to carry devices of a plurality of different form factors, one device at a time;
wherein, in an installed state of the light pipe assembly in the device carrier, the light receiving ends of the one or more light pipes are positioned such that:
a first subset of the light receiving ends are aligned with one or more indicator lights of a first device in a coupled state of the first device to the device carrier; and
a second subset of the light receiving ends are aligned with one or more indicator lights of a second device in a coupled state of the second device to the device carrier; and
wherein the first device and the second device have mutually different indicator light arrangements.

11. The light pipe assembly of claim 10, wherein the one or more light pipes comprise:
a first light pipe comprising:
first and second light receiving ends of the light receiving ends,
a first light transmitting end of the light transmitting ends; and
first and second elongate light conductors, of the elongate conductors, extending from the first and second light receiving ends, respectively, to the first light transmitting end.

12. The light pipe assembly of claim 11,
wherein the first subset of light receiving ends comprises the first light receiving end and the second subset of light receiving ends comprises the second light receiving end.

13. The light pipe assembly of claim 11, wherein the one or more light pipes comprise:
a second light pipe comprising:
a third light receiving end of the light receiving ends;
a second light transmitting end of the light transmitting ends; and
a second elongate light conductor extending between the third light receiving end and the second light transmitting end.

14. The light pipe assembly of claim 13,
wherein the housing comprises a first housing component and a second housing component engaged with the first housing component, wherein the housing is configured to be disposed within a front structure of the device carrier in the installed state of the light pipe assembly in the device carrier such that the first side of the housing faces a device carried by the device carrier and the second side faces a front of the device carrier.

15. The light pipe assembly of claim 13,
wherein the first subset of light receiving ends comprises the first light receiving end and the third light receiving end; and
wherein the second subset of light receiving ends comprises the second light receiving end and the third light receiving end.

16. A method of installing a solid state drive (SSD) in a compute system rack, comprising:
providing an adaptable SSD carrier compatible with a plurality of different SSDs having mutually different form factors and configured to carry one SSD of the plurality of SSDs at a time, the adaptable SSD carrier comprising:
- a front structure,
- a first side structure extending perpendicularly from a first end of the front structure, and
- a second side structure extending perpendicularly from a second end of the front structure, the front structure and the first and second side structures defining an internal volume;

providing one or more light pipes extending through the front structure and configured to direct light from a plurality of light receiving ends of the light pipes positioned at a rear face of the front structure to one or more light transmitting ends of the light pipes positioned at a front face of the front structure, wherein the plurality of SSDs have mutually different arrangements of indicator lights and the plurality of light receiving ends is arranged to receive light from the respective indicator lights of the plurality of SSDs in respective installed states of the plurality of SSDs in the adaptable SSD carrier;

inserting a first SSD of the plurality of SSDs into the internal volume; and inserting the adaptable SSD carrier and the first SSD into a bay of the compute system rack such that the front face of the front structure is exposed at a front of the compute system rack.

17. The method of claim 16, further comprising:
inserting an adaptor between the first side structure and the second side structure to conform the adaptable SSD carrier to a form factor of the first SSD.

18. The method of claim 16, wherein providing the at least one light pipe comprises providing a first light pipe comprising:
providing a first elongate light conductor extending between a first light receiving end of the plurality of light receiving ends and a first light transmitting end of the plurality of light receiving ends; and providing a second elongate light conductor extending between a second light receiving end of the plurality of light receiving ends and the first light transmitting end, wherein the first light receiving end is positioned to receive light from a first indicator LED of a first SSD having a first arrangement of indicator LEDs in an installed state of the first SSD in the adaptable SSD carrier, wherein the second light receiving end is positioned to receive light from a second indicator LED of a second SSD having a second arrangement of indicator LEDs in an installed state of the second SSD in the adaptable SSD carrier, and wherein the first light transmitting end is common to both the first and second elongate light conductors.

19. The method of claim 18, wherein providing the at least one light pipe further comprises:
providing a second light pipe having a third elongate light conductor extending between a third light receiving end of the plurality of light receiving ends and a second light transmitting end of the plurality of light transmitting ends, wherein the third light receiving end is to receive light from a third indicator LED of the first SSD in the installed state of the first SSD in the adaptable SSD carrier and to receive light from a fourth indicator LED of the second SSD in the installed state of the second SSD in the adaptable SSD carrier.

20. The method of claim 19, further comprising:
disposing a light pipe carrier structure in the front structure of the adaptable SSD carrier, the light pipe carrier structure supporting the first light pipe and the second light pipe.

* * * * *